United States Patent [19]

Takayama

[11] Patent Number: 5,483,209

[45] Date of Patent: Jan. 9, 1996

[54] RECEPTION BAND SWITCHING CIRCUIT WITH VARIABLE ATTENUATION CONTROL

[75] Inventor: Akira Takayama, Soma, Japan

[73] Assignee: Alps Electric Co., Ltd., Tokyo, Japan

[21] Appl. No.: 342,396

[22] Filed: Nov. 18, 1994

Related U.S. Application Data

[63] Continuation of Ser. No. 126,451, Sep. 22, 1993, abandoned.

[30] Foreign Application Priority Data

Oct. 1, 1992 [JP] Japan ................. 4-68719 U

[51] Int. Cl.⁶ .............. H04B 1/18; H03H 7/12
[52] U.S. Cl. .............. 333/174; 455/266; 455/188.1; 455/340; 455/234.1
[58] Field of Search .................. 333/101, 103, 333/126, 129, 132, 81 R, 175, 167, 174; 455/188.1, 266, 340, 199.1, 200.1, 234.1; 330/124 R, 126, 284

[56] References Cited

U.S. PATENT DOCUMENTS 5,023,939  6/1991  Hori ........................ 455/188.1
5,068,918  11/1991  Verheijen et al. ........... 455/142

FOREIGN PATENT DOCUMENTS

0136730  10/1980  Japan ...................... 455/188.1
0131616  6/1987  Japan ........................ 333/167
0114218  5/1989  Japan ........................ 455/266
0039406  6/1991  Japan .

*Primary Examiner*—Benny Lee
*Assistant Examiner*—Justin P. Bettendorf
*Attorney, Agent, or Firm*—Guy W. Shoup; Parick T. Bever

[57] ABSTRACT

The invention provides a filter circuit for use in a double-conversion TV tuner exhibiting low diode insertion loss, in which intermodulation distortion does not occur even when an incoming signal has a large amplitude. In the filter circuit according to one preferred embodiment of the invention, there are provided three bandpass filters (BPFs) which allow corresponding RF signals in different frequency bands to pass through them, and six variable attenuation diodes whose impedance is controlled by an AGC voltage applied to an AGC terminal (16). There are also provided switching diodes (20) disposed between an input terminal (1) and the inputs of three BPFs so that the switching diodes (20) select exclusively one of three BPFs so as to apply an RF signal received at the input terminal (1) only to the selected BPF (it will be assumed hereinbelow that the BPF (21) is selected). In this arrangement, not only the impedance of variable attenuation diodes (22, 23) in the selected BPF (21) which provides the extracted RF signal, but the impedance associated with all variable attenuation diodes is controlled by the AGC voltage.

3 Claims, 6 Drawing Sheets

RECEPTION BAND SWITCHING CIRCUIT WITH VARIABLE ATTENUATION CONTROL

This application is a continuation of application Ser. No. 08/126,451, filed Sep. 22, 1993 now abandoned.

BACKGROUND OF THE INVENTION

1. Field of the Invention

The present invention relates to a filter circuit for use in a double-conversion TV tuner.

2. Description of the Related Art

To replace a conventional single-conversion TV tuner, there has been proposed a double conversion technique in which two-step frequency conversion is performed (in the case of a tuner used in Japan, an RF signal in a frequency range of 90 MHz to 770 MHz is first up-converted to a signal having a frequency of 965.25 MHz, then it is down-converted to a signal having a frequency of 58.5 MHz).

In contrast to the single-conversion technique which needs essentially tracking adjustment, this double-conversion technique does not need it. This prevents distortion in the output waveform which otherwise would occur due to the tracking adjustment error. Thus, the double-conversion technique is now receiving much attention as a next generation tuner technology.

A tuner using the double-conversion technique can be configured by using only one input filter for passing RF signals in a desired frequency band. However, in this case, all signals within the frequency band are applied to the following circuits including an RF amplifier, a first mixer, etc., and these signals produce intermodulation distortion. To reduce the intermodulation distortion, a conventional double-conversion tuner is usually configured such that the frequency band is divided into three to five narrower bands so as to separately receive the signals in respective divided bands. For example, in the case of a conventional double-conversion tuner shown in FIG. 3, there are provided three input filters having different pass-bands so as to separately receive the incoming signals for each of three frequency bands.

Figure 3:
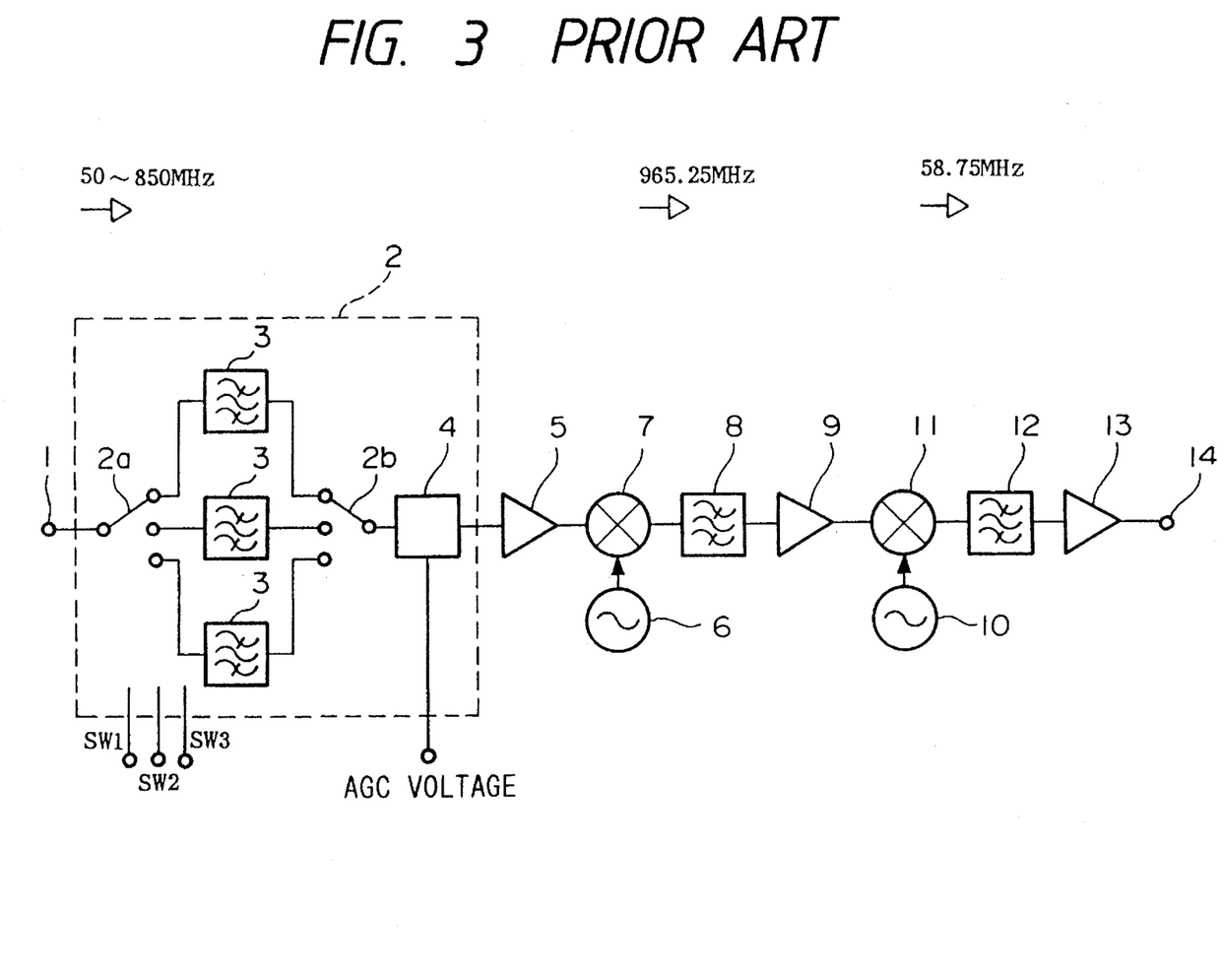
FIG. 3 is a block diagram showing the configuration of a conventional double-conversion tuner.

As shown in FIG. 3, from RF signals provided via an input terminal 1 which is one end of a signal transmission line, only signals within a desired frequency band are extracted in a filter circuit 2, and at the same time the levels of these signals are made at a predetermined level. Then, these signals are applied as an RF extracted signal to an RF amplifier 5. The RF extracted signal is amplified by the RF amplifier 5, then the signal is mixed with a first local oscillation signal output from a first local oscillator 6 at a first mixer 7 so as to up-convert the signal to a first intermediate frequency signal (965.25 MHz).

After the first intermediate frequency signal passes through a bandpass filter (BPF) 8, it is amplified by a first intermediate frequency amplifier 9 and applied to a second mixer 11. The first intermediate frequency signal applied to the second mixer is mixed with a second local oscillation signal output from a second local oscillator 10 so as to down-convert it to a second intermediate signal (58.25 MHz).

Then, after passing through a BPF 12, the second intermediate signal is amplified by a second intermediate amplifier 13 and output from an output terminal 14.

In the filter circuit 2 shown in FIG. 3, reference numeral 3 denotes BPFs 3 which allow RF signals having a frequency in the range of respective different frequency band to pass through them. Reference numerals 2a and 2b denote selection switches which exclusively select only one of BPFs 3 to which the RF signal is to be supplied, wherein selection-switching is performed according to selection signals SW1, SW2, and SW3 supplied from a control circuit (not shown) depending on a channel to be received. Reference numeral 4 denotes a variable attenuator for attenuating the RF extracted signal provided at the common terminal of the selection switch 2b to a predetermined level according to a gain control signal (hereinafter referred to as AGC voltage) supplied from a control circuit (not shown).

Figure 4:
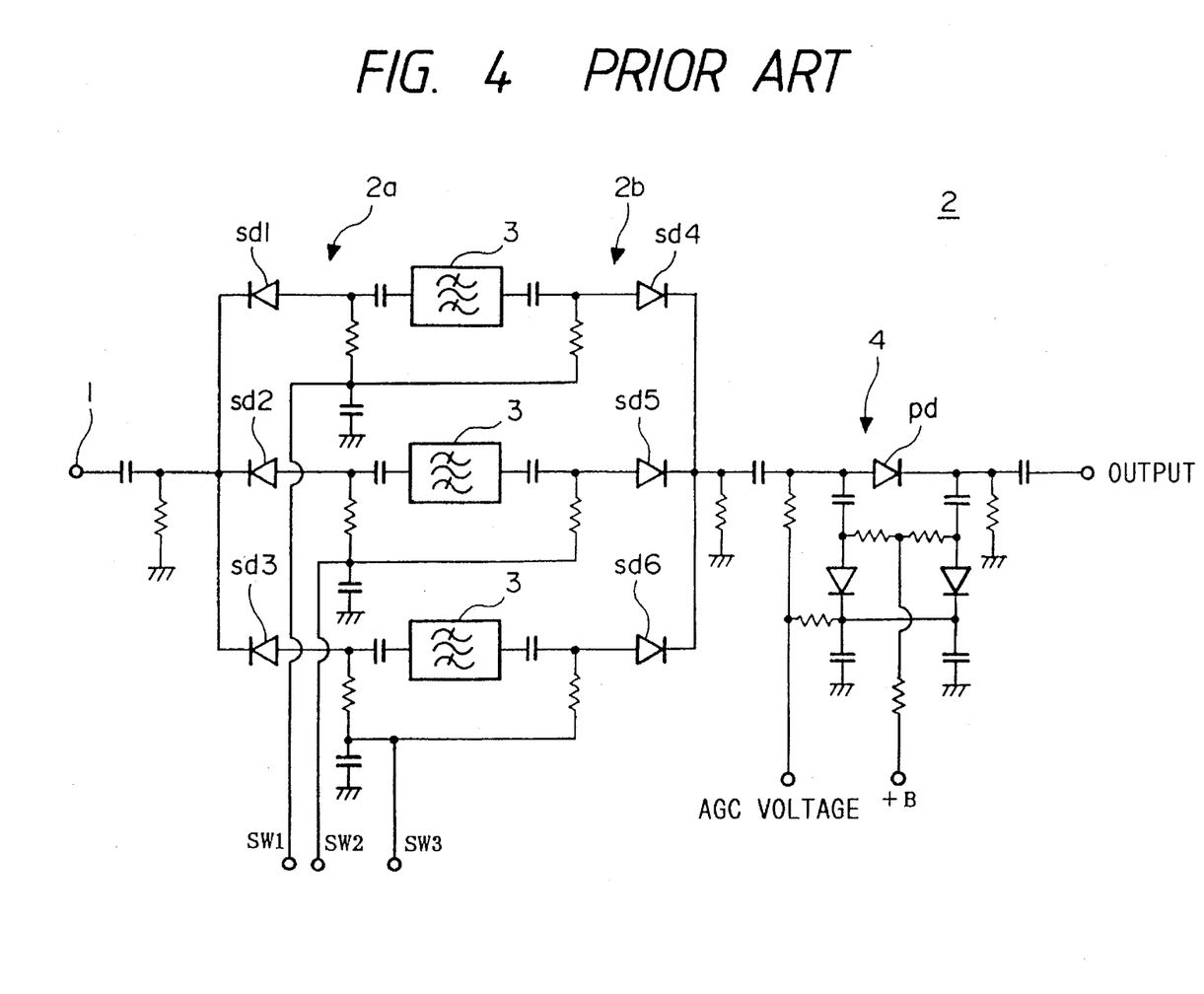
FIG. 4 is a circuit diagram showing a first example of the configuration of a conventional filter circuit (2)

FIG. 4 shows an example of a circuit configuration for the filter circuit 2. In this figure, the elements corresponding to those in FIG. 3 are denoted by the same reference numerals and those will not be described hereinafter. In the filter circuit 2 shown in FIG. 4, although intermodulation distortion due to the large amplitude of an incoming signal does not occur, insertion loss is introduced by diodes such as switching diodes sd1 and sd4 for performing switching operation and a pin diode pd for attenuating the extracted RF signal which are inserted in a path through which RF signals and the extracted RF signal are transmitted.

Figure 5:
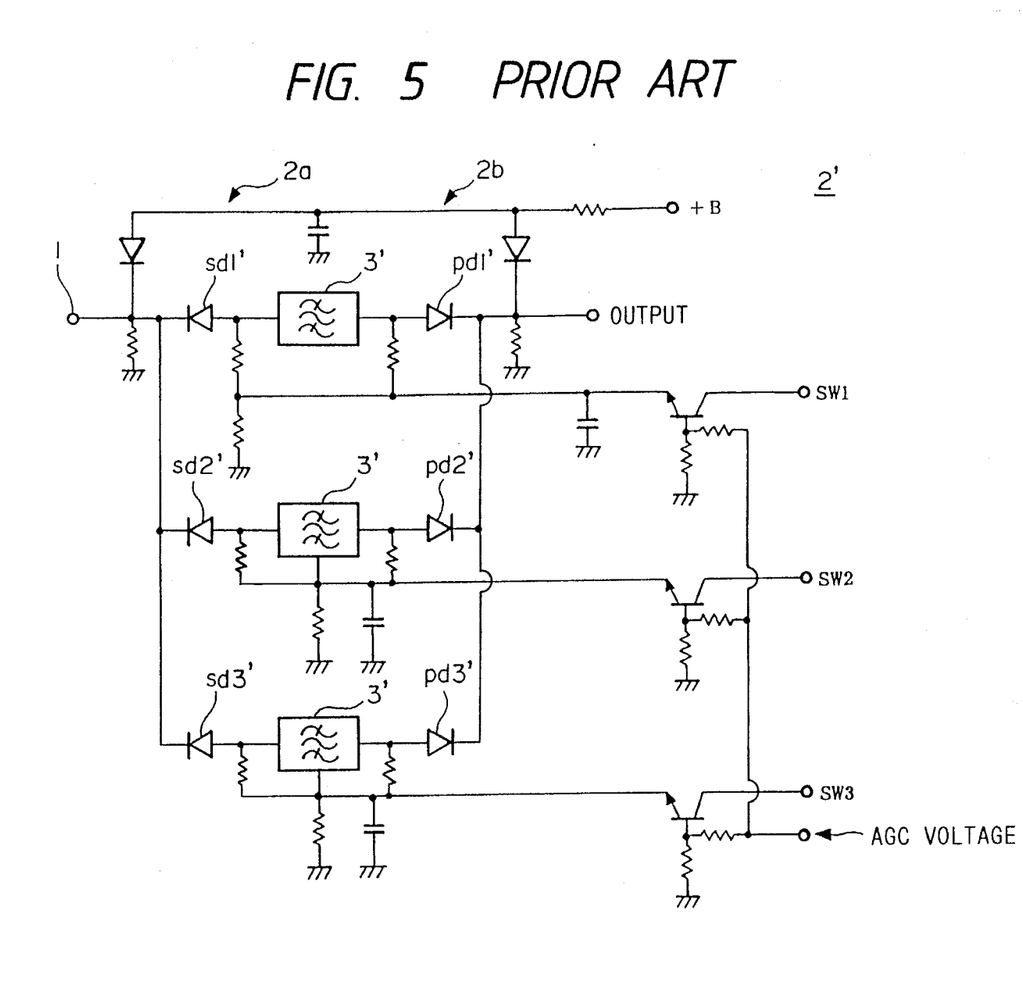
FIG. 5 is a circuit diagram showing a second example of the configuration of the conventional filter circuit (2')

FIG. 5 shows a filter circuit 2' which has been proposed to solve the above problem. In this figure, elements corresponding to those in FIG. 4 are denoted by the same reference numerals and those will not described again hereinafter. To reduce insertion loss due to the diodes, in the circuit shown in FIG. 5, the number of diodes inserted in the path through which the RF signals and the extracted RF signal are transmitted is reduced to two by arranging such that one diode acts as both of a pin diode and a switching diode. For example, in a path having a switching diode sd' and a pin diode pd1', no additional diode exists in this path and the total number of the inserted diodes in this path is two.

Figure 6:
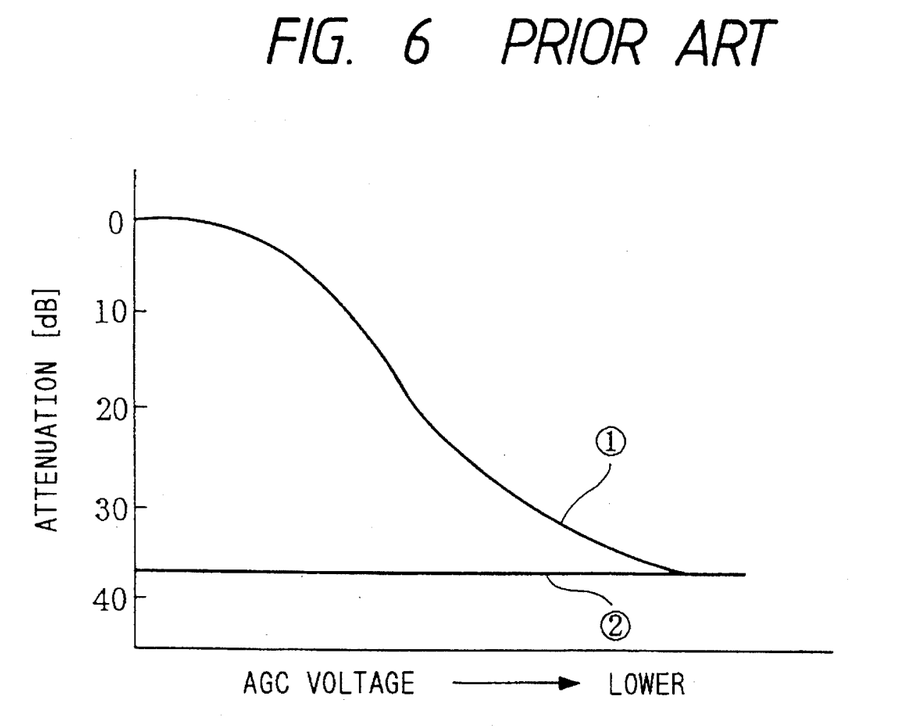
FIG. 6 is a graph showing an example of the characteristics of the filter circuit (2') shown in FIG. 5.

In the filter circuit 2', the attenuation associated with the extracted RF signal output from a selected one of BPFs 3' relative to the RF signal applied to the filter circuit 2' changes according to the AGC voltage. This change occurs in such a manner that the attenuation increases as the AGC voltage decreases and the attenuation becomes constant when the AGC voltage is lower than a predetermined value, as indicated by a curve ① in FIG. 6, which is a typical characteristic of a reverse AGC type. The attenuation associated with the extracted RF signals output from the non-selected BPF3' is constant regardless of the AGC voltage as indicated by a curve ② in FIG. 6.

More detailed description of the above technique can be found in Japanese laid-open. No. 3-39406.

Because the filter circuit 2' having a circuit configuration shown in FIG. 5 has such characteristics as described above, when the amplitude of the input signal is large, the difference in signal level becomes small between the extracted RF signal output from selected BPF 3' and the extracted RF signal output from non-selected BPF 3'. As a result, in this case, the extracted signal which is not extracted to a sufficient degree is applied to a following amplifier 5. This leads to a problem that intermodulation distortion easily occurs in circuits following the filter circuit 2'.

SUMMARY OF THE INVENTION

In view of the above, it is an object of the present invention to provide a filter circuit having a low insertion loss which can prevent intermodulation distortion even when a signal having a large amplitude is input.

According to one aspect of the present invention, there is provided a filter circuit comprising:

a plurality of signal passing and attenuating means having a variable attenuation circuit whose amount of attenuation is controlled according to a gain control signal given to the variable attenuation circuit, each the signal passing and attenuating means being coupled in parallel with respect to a signal transmission line, the plurality of signal passing and attenuating means each allowing associated signals in respective different frequency bands to pass with attenuation by the amount defined by that of the variable attenuation circuit; and selection switching means disposed between inputs of the plurality of signal passing and attenuating means and a preceding circuit, or between outputs of the plurality of signal passing and attenuating means and a succeeding circuit, the selection switching means exclusively selecting one of the plurality of signal passing and attenuating means and connecting the selected signal passing and attenuating means to the preceding or succeeding circuit so as to transmit the only signals output from the selected signal passing and attenuating means;

wherein not only the amount of attenuation associated with the signal passing and attenuating means exclusively selected by the selection switching means but all amounts of attenuation associated with all signal passing and attenuating means are controlled by the gain control signal.

With this arrangement, when RF signals are input to the plurality of signal passing and attenuating means, each of the plurality of signal passing and attenuating means allows signals in corresponding different bands to pass through it and each of these signals is attenuated with by the amount determined by the gain control signal.

Furthermore, the plurality of selecting switching means perform exclusive switching operation so as to provide the signals output from the corresponding signal passing and attenuating means at the output terminal.

DESCRIPTION OF THE PREFERRED EMBODIMENTS

Figure 1:
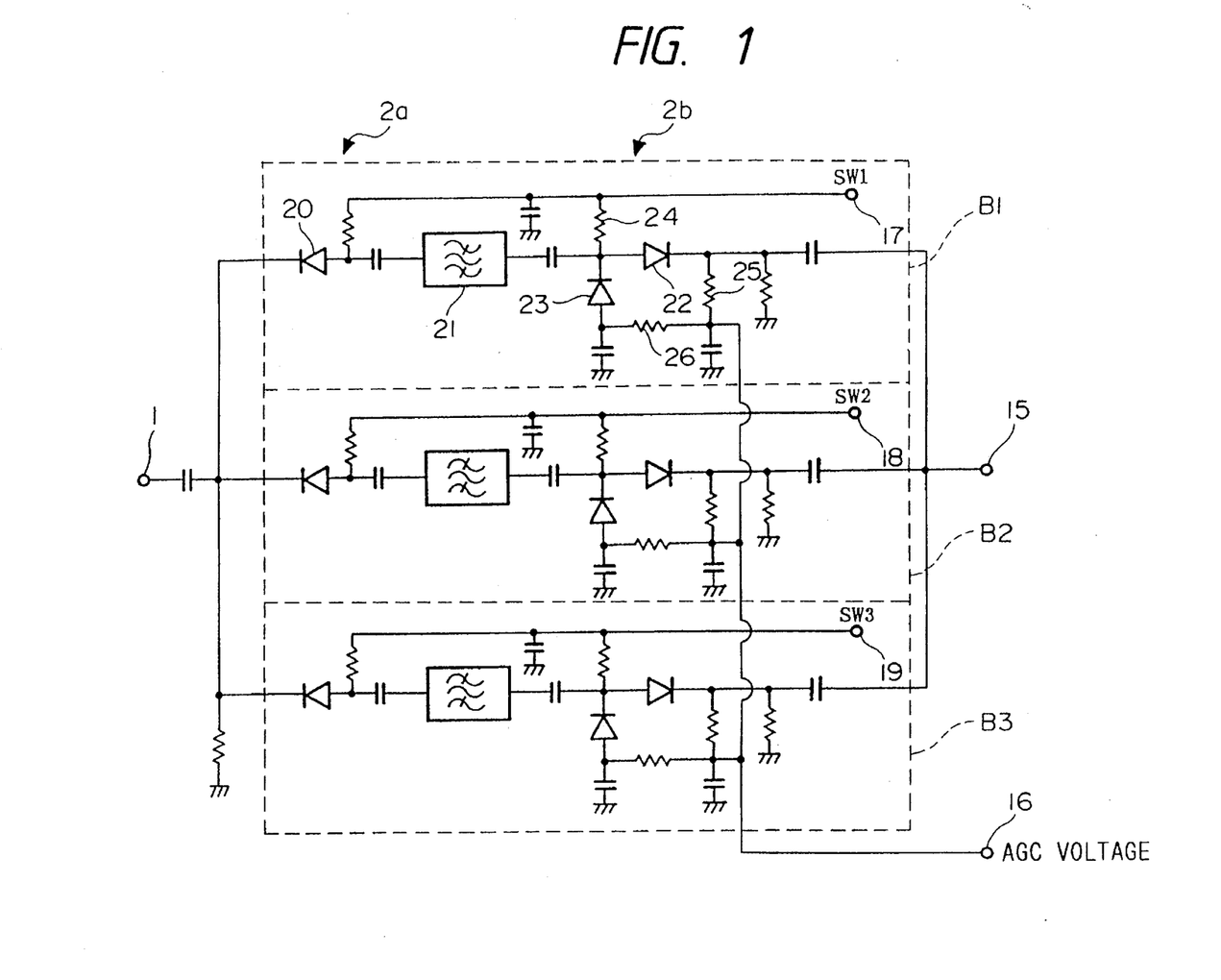
FIG. 1 is a circuit diagram showing the configuration of a filter circuit in accordance with one embodiment of the present invention.

Referring to figures, one embodiment in accordance with the present invention will be described hereinbelow. FIG. 1 is a circuit diagram showing the configuration of a filter circuit in accordance with one embodiment of the present invention.

In FIG. 1, reference marks B1–B3 each denote circuit blocks which perform predetermined processing on signals applied via an input terminal 1 and which output resultant extracted RF signals via an output terminal 15, wherein these circuit blocks are connected in parallel with respect to a signal transmission line. The levels of the extracted RF signals output from the circuit blocks B1–B3 vary according to a voltage (for example, a DC voltage in the range of 0 to 5 V) supplied via an AGC terminal 16 and according to selection signals SW1–SW3 via selection terminals 17–19.

In this configuration, the AGC voltage applied to the AGC terminal 16 is set to such a value by a control circuit (not shown) that the extracted RF signal output from the output terminal 15 becomes at a predetermined level. Only one of the selection signals SW1–SW3 becomes at an "H" level (for example, DC voltage of 5 V).

Now, the configuration of the circuit block B1 will be described in detail. The circuit blocks B2 and B3 have the same configurations and have the same functions as the circuit block B1, therefore, the circuit blocks B3 and B2 will not be described. In the circuit block B1, reference numeral 20 denotes a switching diode whose anode is supplied with a selection signal SW1 of either "H" level or "L" level (for example, a DC voltage of 0 V) via the selection terminal 17, wherein when the selection signal SW1 is at the "H" level, the switching diode 20 turns on to allow the RF signals applied to its cathode via the input terminal 1 to pass through it. That is to say, the selection switch 17 and the switching diode 20 operate as one of switches in the selection switching means.

Reference numeral 21 denotes a BPF following the switching diode 20, which extracts only signals in the range of a predetermined frequency band from the RF signals supplied from the switching diode 20 and outputs the resultant signals as an extracted RF signals.

Reference numerals 22 and 23 denote a variable attenuation diode consisting of a pin diode (variable attenuation circuit) which allows the extracted RF signals applied from the BPF 21 to pass by an amount which provides a signal level corresponding to the difference in voltage between the anode and the cathode. The extracted RF signals, as well as the selection signal SW 1 which are applied via the selection terminal 17 and via a resistor 24, is applied to the anode of the variable attenuation diode 22. The AGC voltage is applied to the cathode of the variable attenuation diode 22 via the AGC terminal 16 and a resistor 25.

On the other hand, the extracted RF signals and selection signal SW1 are applied to the cathode of the variable attenuation diode 23, and the AGC voltage is applied to the anode of the variable attenuation diode 23 via the AGC terminal 16 and a resistor 26. That is to say, in the circuit block B1 having such a configuration described above, the part except the selection terminal 17 operates as a signal passing and attenuating means which allows signals in the range of a predetermined frequency band to pass through it with a certain amount of attenuation.

In the configuration described above, the AC components of the RF signals are applied to the circuit blocks B1–B3 via the input terminal 1. Because all the circuit blocks B1–B3 have the same configuration and the same functions, the only operation of the circuit block B1 will be described hereinbelow for both cases where the selection signal SW1 of level "H" and level "L" is applied to the selection terminal 17, and the operations of the circuit blocks B2 and B3 will not be described.

When the selection signal SW1 of level "H" is applied to the selection terminal 17, the circuit block B1 operates as follows.

The RF signals applied to the circuit block B1 via the input terminal 1 are supplied to the cathode of the switching diode 20. Because the selecting signal SW1 of level "H" is applied to the anode of the switching diode 20 via the selecting terminal 17, the switching diode 20 turns on to supply the RF signals to the BPF 21.

In the BPF 21, RF signals in the range of a predetermined frequency band are extracted and supplied as extracted RF signals to the anode of the variable attenuation diode 22 and the cathode of the variable attenuation diode 23. The selection signal SW1 of level "H" is applied to the anode of the variable attenuation diode 22 and also to the cathode of the variable diode 23 from the section terminal 17 via the resistor 24, while the AGC voltage is applied to the cathode of the variable attenuation diode 22 and also to the anode of the variable attenuation diode 23 from the AGC terminal 16 via the resistor 25.

When the amplitudes of incoming signals are small, the AGC voltage is set to a small value (for example, 0–2 V). As a result, the impedance of the attenuation diode 22 becomes small and the impedance of the attenuation diode 23 becomes large, thus almost all portions of the extracted RF signals are output from the output terminal 15 via the variable attenuation diode 22.

On the other hand, when the amplitudes of incoming signals are large, the AGC voltage is set to a larger value (for example, 3–5 V) than that as in the case described above where the amplitudes or incoming signals are small. As a result, the impedance or the attenuation diode 22 becomes large and the impedance of the attenuation diode 23 becomes small, thus almost all portions of the extracted RF signals pass through the variable attenuation diode 23 and are shunted to the ground via a capacitor. The extracted RF signals passing through the variable attenuation diode 22 undergo a larger amount of attenuation than in the case of small amplitude of incoming signals. An example of relationship between the AGC voltage and the attenuation is shown by a curve ① in FIG. 2.

When the selection signal SW1 applied to the selection terminal 17 is at level "L", the circuit block B1 operates as follows. In the following explanation, only different operations from those in the above case will be described. The selection signal of level "L" is applied to the anode of the switching diode 20 via the selection terminal 17, thus the switching diode 20 turns off. As a result, the RF signals which are attenuated to a large degree are supplied to the BPF 21.

After that, processing similar to that as in the above case is performed and the extracted RF signals are applied to the anode of the variable attenuation diode 22 and also to the cathode of the variable attenuation diode 23. The selection signal SW1 of level "L" is applied to the anode of the variable attenuation diode 22 and the cathode of the variable attenuation diode 23 from the selection terminal 17 via the resistor 24. On the other hand, the AGC voltage is applied to the cathode of the variable attenuation diode 22 and also to the anode of the variable attenuation diode 23 from the AGC terminal 16 via the resistors 25 and 26.

When the incoming signals have small amplitudes, the AGC voltage is set to, for example, 0 to 2 V. As a result, the impedance of the variable attenuation diode 22 becomes large and the impedance of the variable attenuation diode 23 becomes small. Thus, almost all portions of the extracted RF signals pass through the variable attenuation diode 23 and are shunted to the ground via the capacitor. As a result, the extracted RF signals passing through the variable attenuation diode 22 are attenuated to a large degree.

Figure 2:
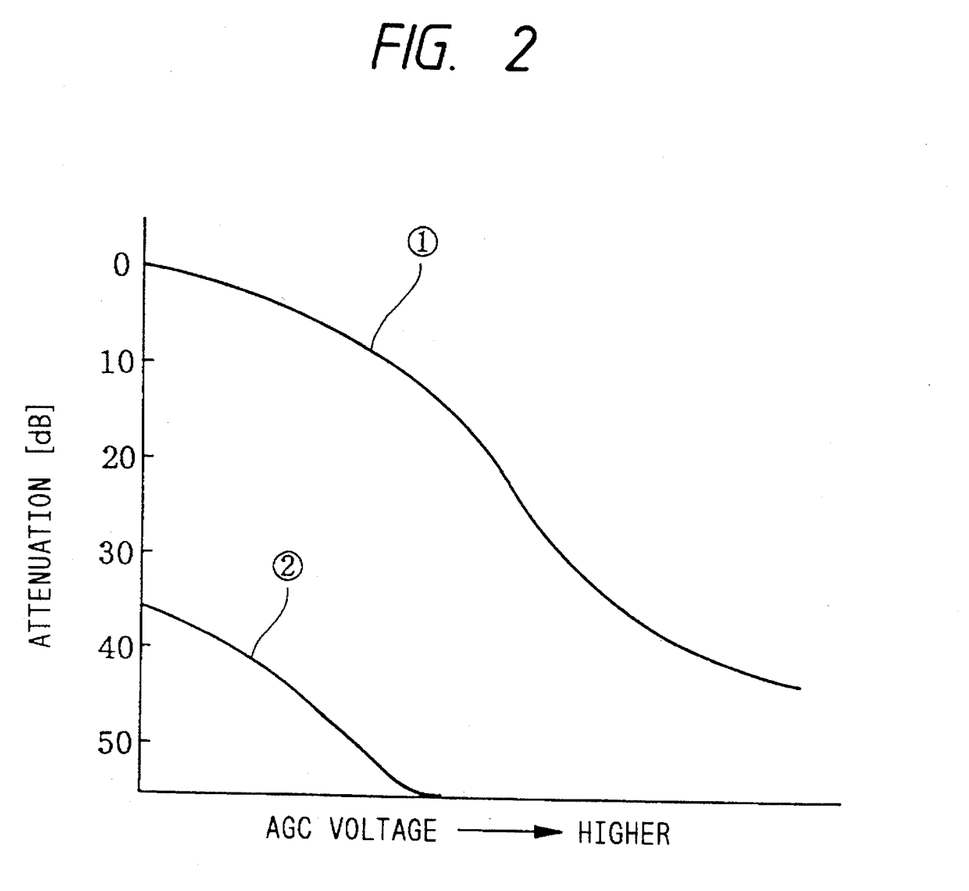
FIG. 2 is a graph showing an example of the characteristics of the filter circuit in accordance with one embodiment of the present invention.

On the other hand, when the incoming signals have large amplitudes, the AGC voltage becomes larger (for example, 3–5 V) than in the above case where the incoming signals have small amplitudes. As a result, the impedance of the variable attenuation diode 22 becomes large. That is to say, the extracting RF signals passing through the variable attenuation diode 22 undergo much more attenuation. The curve ② in FIG. 2 shows an example of a relationship between the AGC voltage and the amount of attenuation. Thus, the circuit block B1 operates in such a manner as described above according to the level of the selection signal SW1. As for the selection signals SW1–SW3 which are applied to respective three selection terminals, only one of them is exclusively maintained at level "H". Therefore, only one of circuit blocks B1–B3 is in operation where the selection signal of level "H" is given to the selection terminal, and the other two are in operation where the selection signal of level "L" is given to the selection terminal.

As shown by the curves in FIG. 2, as the AGC voltage increases, the level of the extracted RF signal decreases which is output from the circuit block in operation where the selection signal of level "H" is applied to the selection terminal and at the same time the levels of the extracted RF signals output from the other circuit blocks also decrease. That is to say, there is a large amount of difference in level between the extracted RF signal output from one circuit block and the extracted RF signal output from another circuit block in different operation regardless of the magnitude of the AGC voltage. As a result, even when the incoming signal has a large amplitude, it becomes possible to achieve small intermodulation distortion with low insertion loss across diodes.

In the above embodiment, various kinds of values are given assuming that the invention is applied to use in Japan. However, these values can be modified so that the invention may also be applied to use in abroad where there exist differences in, for example, a receiving frequency band.

According to the present invention, as described above, the signal passing and attenuating means each attenuate associated signals in different ranges of respective frequency bands by predetermined desired amounts. As a result, even when the incoming signal has a large amplitude, there exists a large amount of difference in level between signals in a frequency band to be received and signals in the other frequency bands, thus it is possible to achieve low intermodulation distortion.

What is claimed is:

1. A reception band filter circuit with variable attenuation control for filtering a selected frequency band from a reception signal in response to a switching signal, the switching circuit comprising:

a plurality of band pass filters connected in parallel between an input node and an output node, each band pass filter including an input terminal and an output terminal;

a plurality of switching circuits, each switching circuit including a switch device connected between the input node and the input terminal of one of the band pass filters such that reception signals applied to the input node must pass through the switch device to be received by said one of the band pass filters, each switching circuit also being connected to the output terminal of said one of the band pass filters; and a plurality of gain control circuits connected to receive a common gain control signal, each gain control circuit being connected between the output terminal of an associated one of the band pass filters and the output node;

wherein each gain control circuit comprises a diode having a cathode connected to the output terminal of said one band pass filter, and an anode connected to ground through a capacitor, the anode also being connected to receive the common gain control signal.

2. A reception band filter circuit with variable attenuation control for filtering a selected frequency band from a reception signal in response to a switching signal, the switching circuit comprising:

a plurality of band pass filters connected in parallel between an input node and an output node, each band pass filter including an input terminal and an output terminal;

a plurality of switching circuits, each switching circuit including a switch device connected between the input node and the input terminal of one of the band pass filters such that reception signals applied to the input node must pass through the switch device to be received by said one of the band pass filters, each switching circuit also being connected to the output terminal of said one of the band pass filters; and a plurality of gain control circuits connected to receive a common gain control signal, each gain control circuit being connected between the output terminal of an associated one of the band pass filters and the output node, wherein each gain control circuit comprises:

a first diode including a first anode connected to the output terminal of one of the plurality of band pass filters, and a first cathode connected to the output node, the first cathode also being connected to receive the common gain control signal; and a second diode having a second cathode connected to the output terminal of said one band pass filter, and a second anode connected to ground through a capacitor, the second anode also being connected to receive the common gain control signal.

3. A reception band filter circuit with variable attenuation control for filtering a selected frequency band from a reception signal in response to a switching signal, the switching circuit comprising:

a plurality of band pass filters connected in parallel between an input node and an output node, each band pass filter including an input terminal and an output terminal;

a plurality of switching circuits, each switching circuit including a switching diode having a cathode connected to the input node and an anode connected to the input terminal of the band pass filter such that reception signals applied to the input node must pass through the switching diode to be received by said one of the band pass filters;

switching signal transmission means for applying a switching signal to the anode of the switching diode, wherein the switching diode transmits input signals from the input node to the band pass filter in response to the switching signal; and a plurality of gain control circuits connected to receive a common gain control signal, each gain control circuit being connected between the output terminal of an associated one of the band pass filters and the output node, wherein each gain control circuit comprises:

a first diode including a first anode connected to the output terminal of one of the plurality of band pass filters, and a first cathode connected to the output node, the first cathode also being connected to receive the common gain control signal; and a second diode having a second cathode connected to the output terminal of said one band pass filter, and a second anode connected to ground through a capacitor, the second anode also being connected to receive the common gain control signal;

wherein the switching signal transmission means is connected to the first anode of the first diode and the second cathode of the second diode.

* * * * *